US012382607B1

(12) United States Patent
Kelly et al.

(10) Patent No.: US 12,382,607 B1
(45) Date of Patent: Aug. 5, 2025

(54) LIQUID IMMERSION CHASSIS LINER (71) Applicant: Amazon Technologies, Inc., Seattle, WA (US)

(72) Inventors: Noah Thomas Kelly, Cascade, CO (US); William Mark Megarity, Renton, WA (US)

(73) Assignee: Amazon Technologies, Inc., Seattle, WA (US)

( * ) Notice: Subject to any disclaimer, the term of this patent is extended or adjusted under 35 U.S.C. 154(b) by 281 days.

(21) Appl. No.: 18/310,898

(22) Filed: May 2, 2023

(51) Int. Cl.
*H05K 7/20* (2006.01)
*G06F 1/20* (2006.01)

(52) U.S. Cl.
CPC ........... *H05K 7/20272* (2013.01); *G06F 1/20* (2013.01); *H05K 7/20236* (2013.01); *H05K 7/20772* (2013.01)

(58) Field of Classification Search
CPC combination set(s) only.
See application file for complete search history.

(56) References Cited

U.S. PATENT DOCUMENTS

| 3,316,415 | A | 4/1967  | Taylor         |
|-----------|---|---------|----------------|
| 3,403,238 | A | 9/1968  | Buehler et al. |
| 3,602,774 | A | 8/1971  | Grant et al.   |
| 3,660,784 | A | 5/1972  | Scharfman      |
| 3,699,769 | A | 10/1972 | Bondurant      |
| 4,030,298 | A | 6/1977  | Sandoval       |
| 4,938,026 | A | 7/1990  | Goldstein      |
| 4,996,842 | A | 3/1991  | Goldstein      |
| 5,150,277 | A | 9/1992  | Bainbridge et al. |
| 5,234,591 | A | 8/1993  | Darnell et al. |
| 5,361,188 | A | 11/1994 | Kondou et al.  |

(Continued)

FOREIGN PATENT DOCUMENTS

| CN | 108919926 | 11/2018 |
|----|-----------|---------|
| EP | 3158455   | 3/2020  |

(Continued)

OTHER PUBLICATIONS

Hashiba, Tomohiko, "Electroic Machinery Cooling System," Wingturf Co., LTD., Sep. 18, 2014, Entire Document (Translation of WO 2014142098), 2014.

(Continued)

*Primary Examiner* — Lisa Lea-Edmonds
(74) *Attorney, Agent, or Firm* — Alexander A. Knapp; Kowert, Hood, Munyon, Rankin & Goetzel, P.C.

(57) ABSTRACT

Systems and methods for providing and using a liner including one or more rigid over-molds for a chassis of a computing device cooled with a liquid fluid are disclosed. The liner may include a flexible membrane configured to be positioned in a chassis to form a liquid barrier that retains a liquid cooling fluid and one or more rigid over-molds configured to align components in fixed positions relative to other respective components or the chassis. The rigid over-molds may be located on the interior and/or the exterior of the liner to fixedly couple to components and/or the chassis. A set of over-molds may also be configured to enable insertion of connectors exterior to the liner, wherein a first rigid over-mold on the interior of the liner may be aligned with a second rigid over-mold on the exterior of the liner.

20 Claims, 12 Drawing Sheets

(56) References Cited

U.S. PATENT DOCUMENTS

| | | | |
|---|---|---|---|
| 5,491,363 A | 2/1996 | Yoshikawa | |
| 5,506,750 A | 4/1996 | Carteau et al. | |
| 5,796,580 A | 8/1998 | Komatsu et al. | |
| 5,907,473 A | 5/1999 | Przilas | |
| 6,170,561 B1 | 1/2001 | O'Grady | |
| 6,234,591 B1 | 5/2001 | Driscoll et al. | |
| 6,459,571 B1 | 10/2002 | Carteau | |
| 6,506,111 B2 | 1/2003 | Sharp et al. | |
| 6,765,796 B2 | 7/2004 | Hoffman et al. | |
| 6,775,137 B2 | 8/2004 | Chu et al. | |
| 6,801,428 B2 | 10/2004 | Smith et al. | |
| 6,955,062 B2 | 10/2005 | Tilton et al. | |
| 6,955,063 B2 | 10/2005 | Adiga et al. | |
| 6,975,027 B2 * | 12/2005 | Farrar | H01L 23/42 361/677 |
| 6,975,587 B1 | 12/2005 | Adamski et al. | |
| 7,085,133 B2 | 8/2006 | Hall | |
| 7,200,008 B1 | 4/2007 | Bhugra | |
| 7,359,186 B2 | 4/2008 | Honda et al. | |
| 7,489,509 B2 | 2/2009 | Keenan et al. | |
| 7,505,269 B1 | 3/2009 | Cosley et al. | |
| 7,508,663 B2 | 3/2009 | Coglitore | |
| 7,626,252 B2 * | 12/2009 | Farrar | H01L 23/42 257/714 |
| 7,742,297 B2 * | 6/2010 | Behrens | H01L 23/467 174/15.1 |
| 7,760,502 B2 | 7/2010 | Meyer, III et al. | |
| 7,869,210 B2 | 1/2011 | Moss | |
| 8,028,796 B2 | 10/2011 | Ishihara | |
| 8,053,748 B2 | 11/2011 | Shah et al. | |
| 8,154,870 B1 | 4/2012 | Czamara et al. | |
| 8,191,841 B2 | 6/2012 | Jeffery et al. | |
| 8,331,095 B2 | 12/2012 | Hu et al. | |
| 8,472,181 B2 | 6/2013 | Doll | |
| 8,511,082 B2 | 8/2013 | Browne et al. | |
| 8,522,569 B2 | 9/2013 | Avery et al. | |
| 8,607,562 B2 | 12/2013 | Browne et al. | |
| 8,760,855 B2 | 6/2014 | Howes et al. | |
| 8,780,558 B2 * | 7/2014 | Miller | H01L 23/473 361/699 |
| 8,844,281 B2 | 9/2014 | Browne | |
| 8,867,204 B1 | 10/2014 | Gardner | |
| 8,879,247 B2 | 11/2014 | Archibald et al. | |
| 8,941,256 B1 | 1/2015 | Czamara et al. | |
| 9,038,379 B2 | 5/2015 | Alexander et al. | |
| 9,284,850 B1 | 3/2016 | Gardner et al. | |
| 9,562,519 B1 | 2/2017 | Gardner et al. | |
| 9,681,588 B1 * | 6/2017 | Eichelberg | H05K 7/2079 |
| 9,681,589 B1 | 6/2017 | Ross et al. | |
| 9,690,337 B1 * | 6/2017 | Eichelberg | H05K 7/20745 |
| 9,904,973 B2 | 2/2018 | Wilt et al. | |
| 9,904,974 B2 | 2/2018 | Wilt et al. | |
| 9,920,750 B1 | 3/2018 | Ross | |
| 9,936,611 B1 | 4/2018 | Bryan et al. | |
| 9,996,464 B2 | 6/2018 | Davis et al. | |
| 10,013,377 B2 | 7/2018 | Davis et al. | |
| 10,070,561 B1 * | 9/2018 | Eichelberg | H05K 7/20272 |
| 10,344,744 B2 | 7/2019 | Ross et al. | |
| 10,426,060 B2 | 9/2019 | Beall et al. | |
| 10,430,916 B2 | 10/2019 | Wilt et al. | |
| 10,628,908 B2 | 4/2020 | Wilt et al. | |
| 10,684,660 B1 * | 6/2020 | Eichelberg | H05K 7/20745 |
| 10,699,367 B2 | 6/2020 | Wilt et al. | |
| 10,798,851 B1 | 10/2020 | Weber | |
| 11,032,939 B2 * | 6/2021 | Tufty | H05K 5/067 |
| 11,055,252 B1 | 7/2021 | Constantinides et al. | |
| 11,071,238 B2 | 7/2021 | Edmunds | |
| 11,210,759 B2 | 12/2021 | Wilt et al. | |
| 11,531,383 B1 | 12/2022 | Cai | |
| 11,553,626 B2 | 1/2023 | Beall et al. | |
| 11,589,476 B2 * | 2/2023 | Ma | H05K 7/20236 |
| 2002/0095470 A1 | 7/2002 | Cochran | |
| 2002/0156918 A1 | 10/2002 | Valdevit | |
| 2004/0057203 A1 | 3/2004 | Rabinovitz | |
| 2004/0218355 A1 | 11/2004 | Bash et al. | |
| 2004/0250562 A1 | 12/2004 | Adiga | |
| 2005/0057898 A1 | 3/2005 | El-Batal et al. | |
| 2005/0078447 A1 | 4/2005 | Hamann et al. | |
| 2005/0174733 A1 | 8/2005 | Novotny | |
| 2005/0237716 A1 | 10/2005 | Chu et al. | |
| 2006/0187634 A1 | 8/2006 | Tanaka et al. | |
| 2007/0053169 A1 | 3/2007 | Carlson et al. | |
| 2007/0091559 A1 | 4/2007 | Malone | |
| 2007/0133173 A1 | 6/2007 | Hsiung | |
| 2007/0233781 A1 | 10/2007 | Starr et al. | |
| 2007/0247808 A1 * | 10/2007 | Behrens | H01L 23/467 257/E23.101 |
| 2008/0084666 A1 | 4/2008 | Kehl et al. | |
| 2008/0123297 A1 | 5/2008 | Tilton | |
| 2008/0229415 A1 | 9/2008 | Kapoor | |
| 2009/0086434 A1 | 4/2009 | Hodes et al. | |
| 2009/0144568 A1 | 6/2009 | Fung | |
| 2010/0039773 A1 | 2/2010 | Tilton | |
| 2010/0091447 A1 | 4/2010 | Jaggers et al. | |
| 2010/0134972 A1 | 6/2010 | Moss | |
| 2010/0154448 A1 | 6/2010 | Hay | |
| 2011/0083827 A1 | 4/2011 | Salyer | |
| 2011/0140456 A1 | 6/2011 | Wittorf et al. | |
| 2011/0255237 A1 | 10/2011 | Doll | |
| 2012/0243170 A1 | 9/2012 | Frink et al. | |
| 2013/0046904 A1 | 2/2013 | Hilland | |
| 2013/0125486 A1 | 5/2013 | Curtin et al. | |
| 2013/0163193 A1 | 6/2013 | Ballantine et al. | |
| 2014/0078668 A1 | 3/2014 | Goulden et al. | |
| 2015/0373115 A1 | 12/2015 | Breakstone | |
| 2018/0052793 A1 | 2/2018 | Fang | |
| 2018/0098458 A1 | 4/2018 | Chainer | |
| 2018/0368289 A1 | 12/2018 | Wang | |
| 2019/0065172 A1 | 2/2019 | Nachimuthu | |
| 2019/0124790 A1 * | 4/2019 | Tufty | H05K 7/20263 |
| 2020/0250119 A1 | 8/2020 | Cannata et al. | |
| 2020/0305307 A1 | 9/2020 | Amos | |
| 2021/0164704 A1 | 6/2021 | Puago Martinez | |
| 2021/0307210 A1 | 9/2021 | Wong | |
| 2021/0385974 A1 | 12/2021 | Ong Kong Chye | |
| 2022/0095481 A1 * | 3/2022 | Ma | H05K 7/20781 |
| 2022/0400584 A1 * | 12/2022 | Enright | H05K 7/20381 |
| 2023/0180439 A9 * | 6/2023 | Enright | H05K 7/20836 361/700 |
| 2024/0381576 A1 * | 11/2024 | Enright | H05K 7/20818 |

FOREIGN PATENT DOCUMENTS

| | | |
|---|---|---|
| KR | 20160043943 | 4/2016 |
| WO | 2014142098 | 9/2014 |

OTHER PUBLICATIONS

Lee Dong Ju, "Apparatus for cooling server room and air conditioning system for data center therewith," Apr. 22, 2016, Naver Business Platform Corp, Entire Document (Translation of KR 20160043943), 2016.

Xu Mengting, "Sprinkling type cooling system and device used for high-density server," Nov. 30, 2018, Nanjing Canatal Data CT Eng. Tech. Co. LTD, Entire Document (Translation of CN 108919926), 2018.

Jillcha Fedaku Wakjira, "The VT1 Shape Memory Alloy Heat Engine Design", Jan. 2001, pp. 1-98, Blacksburg, Virginia.

http://www.imagesco.com/articles/nitinol/09.html, "Nitinol Heat Egines", Downloaded May 7, 2015, pp. 1-4.

* cited by examiner

LIQUID IMMERSION CHASSIS LINER

BACKGROUND

Computer systems may implement various cooling methods to prevent overheating of components. Some computer systems, such as those that generate large amounts of waste heat, such as processing intense computer systems or graphics processing-oriented computing systems, may implement liquid-cooling to remove waste heat from computer components. However, such computer systems require a leak-proof chassis to prevent liquid leaks, which may require the chassis thickness to increase (as compared to a chassis of an air-cooled computer system) and therefore may increase system weight, increase material costs, and decrease space for computer components. Also, manufacturing a leak-proof chassis (e.g., with no holes and welded seams) may increase manufacturing costs and manufacturing time. Additionally, the liquid used in a liquid-cooling method must be compatible with the computing components being cooled, such as a dielectric fluid, to prevent or rapidly quench electrical discharges between components. Moreover, contamination or tampering of the fluid may alter the fluid's dielectric properties and may therefore result in damage to the computer system.

While embodiments are described herein by way of example for several embodiments and illustrative drawings, those skilled in the art will recognize that embodiments are not limited to the embodiments or drawings described. The drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the claims, this term does not foreclose additional structure or steps. Consider a claim that recites: "An apparatus comprising one or more processor units . . . " Such a claim does not foreclose the apparatus from including additional components.

"Configured To." Various units, circuits, or other components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on). The units/components used with the "configured to" language include hardware—for example, circuits, memory storing program instructions executable to implement the operation, etc. Reciting that a unit/component is "configured to" perform one or more tasks is expressly intended not to invoke 35 U.S.C. § 112, paragraph (f), for that unit/component. Additionally, "configured to" can include generic structure that is manipulated by software or firmware to operate in manner that is capable of performing the task(s) at issue.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

"Or." When used in the claims, the term "or" is used as an inclusive or and not as an exclusive or. For example, the phrase "at least one of x, y, or z" means any one of x, y, and z, as well as any combination thereof.

It will also be understood that, although the terms 1, 2, N, etc. may be used herein to describe various elements, these elements should not be limited by these terms. These terms are only used to distinguish one element from another. For example, a component with the term 1 could be termed a second component, and, similarly, a component with the term 2 could be termed a first component, without departing from the scope of the present invention. The first components and the second component are both components, but they are not the same components. Also, the term N indicates that an Nth amount of the elements may or may not exist depending on the embodiments.

DETAILED DESCRIPTION

Computer components used in computing devices generate waste heat that needs to be removed to avoid overheating when in use. To cool computer components, computing devices may be cooled in a variety of manners, such as using passive air cooling (e.g., natural convention), forced air-cooling, or liquid-cooling, as a few examples. Current computing devices that use liquid-cooling systems require leak-proof chassis to prevent liquid from leaking out of the computing devices. However, chassis commonly used in computing device assemblies are not liquid-tight, so custom chassis are required to be designed and manufactured that are free of external facing holes and that have welded seams, among other features, that prevent leaks. This adds considerable costs to liquid cooled designs and also prevents using standard manufacturing techniques often used to manufacture air cooled computing devices.

For example, prevailing industry practices used to manufacture air-cooled chassis include the use of stamped or bended sheet metal that is joined together loosely using tack-welds, rivets, screws, or other suitable fasteners. The current computing devices that use liquid-cooling systems use thicker metal pieces conducive to seam-welding (as opposed to the thinner sheet metal used in air-cooled chassis). This thicker material adds costs to liquid-cooled designs, and costs are further increased when factoring in manufacturing and labor costs as compared to the cheaper and simpler fastener technologies used to manufacture air-cooled computing devices. Collectively these differences (and others) considerably increase the price of a finished liquid-cooled leak-proof computing device as compared to the cost of an air-cooled computing device.

Additionally, a chassis without external facing holes (as is typically used in current liquid-cooled designs) may limit design features and mounting features of the chassis. For example, cable connectors, power connections, etc. may be connected in a limited fashion to avoid through-holes that may function as potential leak sources.

Specifically with regard to the chassis, a custom manufactured chassis may be more labor and process intensive to build and lead to increased chassis cost. The custom manufactured chassis may require a chassis to move through a metal stamping line and a welding line to ensure a leak-proof chassis.

To address these issues and/or other issues, in some embodiments, a flexible plastic liner may be installed in a chassis (such as a commodity chassis) to prevent liquid from leaking. For example, a cheaper and more widely available air-cooled chassis may be adapted to serve as a chassis for a liquid-cooled computing device by inserting a flexible plastic liner. The flexible plastic liner may include a flexible membrane configured to be positioned in a chassis to form a liquid barrier that retains a cooling fluid, such as a dielectric fluid. The flexible liner may include rigid over-molds fixedly coupled to the liner that are configured to align computer components in fixed positions relative to other computer components or the chassis. In some embodiments, a portion of the rigid over-molds may be located on the exterior of the flexible plastic liner and may be configured to fixedly couple the flexible plastic liner to the chassis. In some embodiments, a portion of the rigid over-molds may be located on the interior of the flexible plastic liner and may be configured to fixedly couple to computer components to align the computer components in fixed positions. The flexible plastic liner (when installed in a chassis) may be filled with a cooling fluid (such as a dielectric fluid) that is designed to not conduct electricity between the components. In some embodiments, the rigid over-molds may be configured to accept mounting brackets for the mounting of the components in a way that aligns the components according to an engineered design.

As an example, the flexible membrane may be made of a flexible plastic film and the rigid over-molds may include hardened (e.g., rigid) plastic structures embedded in the flexible film. However, whereas the flexible film is thin and pliable, the rigid over-molds are considerably thicker than the flexible film and are designed to hold their structure and maintain respective separation distances between the rigid over-molds. Also, the rigid over-molds provide mounting surfaces for computer components. For example, the rigid over-molds may allow for mounting the computer components with specific alignments or orientations relative to other computer components or the chassis. Said another way, even though the membrane of the flexible plastic liner is flexible/pliable the rigid over-molds provide a structural skeleton embedded in the flexible plastic liner that can be used to guarantee precise alignments and orientations of computer components without mounting the computer components directly to the chassis.

In some embodiments, the chassis may include both an air-cooled portion and a liquid-cooled portion. The flexible plastic liner may only be inserted into a portion of the chassis so that some components may be outside the flexible plastic liner. For example, components incompatible with liquid may be installed in an air-cooled portion of the chassis outside of the flexible plastic liner, while components compatible with liquid may be installed inside a liquid-cooled portion of the chassis that is lined with the flexible plastic liner. In some embodiments, a set of over-molds may be configured to structurally support a first connector configured to accept insertion of a second connector that connects on an exterior side of the liner. The set of over-molds may facilitate a connection from the first connector to a given one of the components mounted on an interior-side of the liner. The set of over-molds may include a rigid over-mold located on the interior of the liner and a rigid over-mold located on the exterior of the liner, wherein the two rigid over-molds are aligned. For example, a network connection may be achieved by connecting a network connector to an exterior facing connector embedded in a rigid over-mold on an exterior facing surface of the flexible plastic line. Also, a complimentary interior facing connector may be embedded in a rigid over-mold on a interior facing surface of the flexible plastic line and a wire or other conduit may further be at least partially embedded in the over-mold on the exterior facing surface and at least partially embedded in the over-mold on the interior facing surface, wherein the wire or other conduit communicatively couple the exterior facing connector embedded in the exterior facing over-mold with the interior facing connector embedded in the interior facing over-mold. For example, this is illustrated and discussed in more detail herein with regard to FIG. 3.

In some embodiments, a cooling fluid used to fill the flexible plastic liner may include identifying particles and/or a concentration of particles or other chemical constituents that may be used to uniquely identify an un-molested state of the cooling fluid. For example, if the cooling fluid is tampered with, a current concentration of the identifying particles may be compared to an original concentration of the identifying particles to confirm the tampering of the fluid and by how much.

In some embodiments, a liquid cooled computing device may include different types of computer components such as, a printed circuit board, a power supply, a mass storage device and/or an external network connector. In some embodiments, the flexible plastic liner may be sealed using a variety of sealing techniques, such as a heat-melded closure on a top portion of the liner. In some embodiments, the top portion of the liner may be sealed using a re-sealable closure such as, a fold closure, a zip closure, a screw closure, or a snap closure.

The computing device may be assembled by installing the flexible plastic liner inside a chassis, installing the computing components inside the liner (e.g., by fastening the computing components to rigid over-molds of the flexible plastic liner), and filling the flexible plastic liner with a cooling fluid, such as a dielectric fluid. In some embodiments, installing the computing components may involve aligning the computing components to the chassis and other components using the rigid over-molds of the flexible plastic liner. In some embodiments, the plastic liner may be sprayed into the chassis and the rigid over-molds may be fixed to the interior of the sprayed-in liner before the liner fully hardens.

Figure 1:
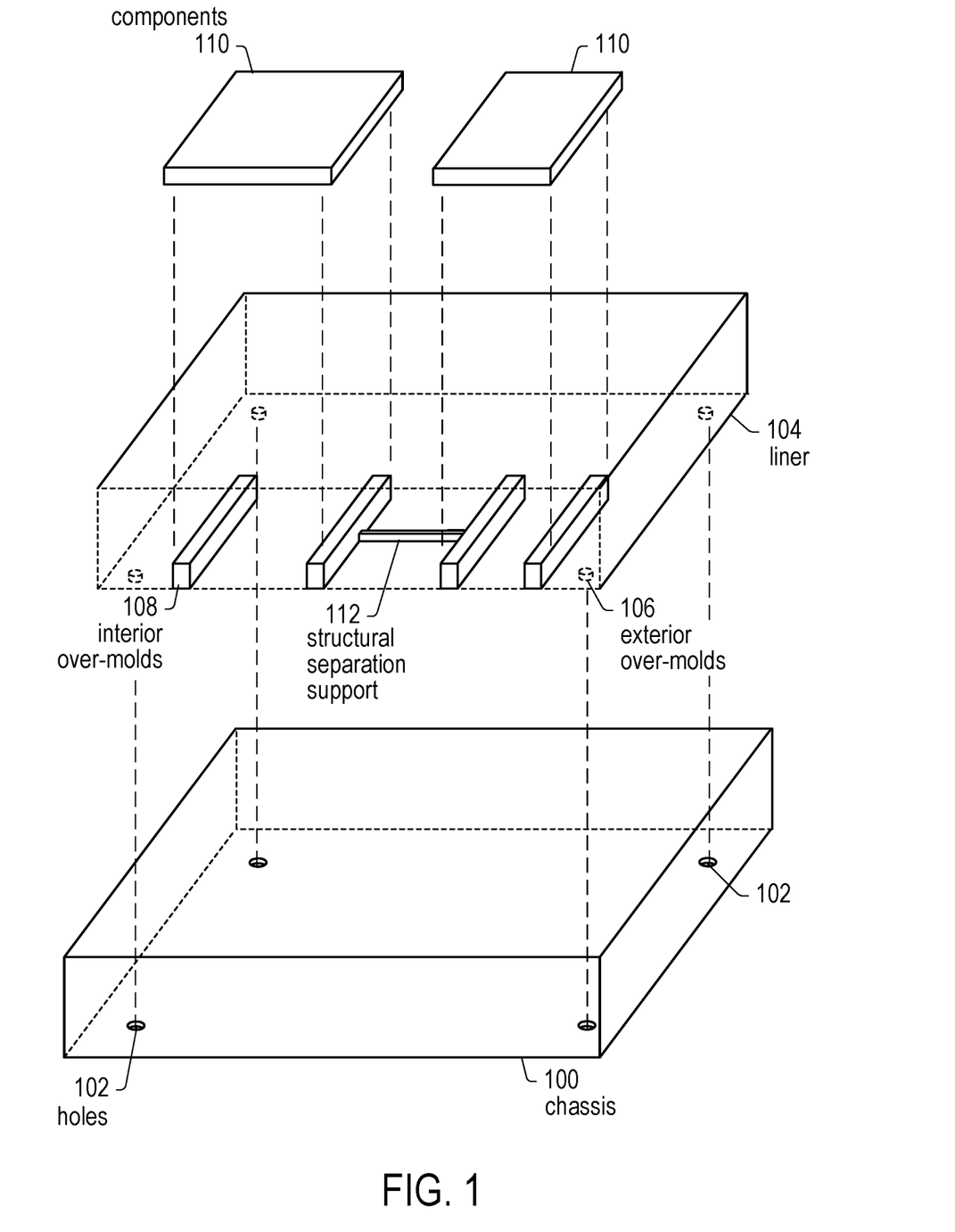
FIG. 1 illustrates an exploded view of a computing system that uses a thermoplastic liquid immersion server chassis liner, the exploded view including a chassis, computer components to be mounted in the chassis, and a flexible liner, wherein the flexible liner includes rigid over-molds for aligning the computer components in fixed positions relative to other computer components or the chassis, according to some embodiments.

FIG. 1 illustrates an exploded view of a computing system that uses a thermoplastic liquid immersion server chassis liner, the exploded view including a chassis, computer components to be mounted in the chassis, and a flexible liner, wherein the flexible liner includes rigid over-molds for aligning the computer components in fixed positions relative to other computer components or the chassis, according to some embodiments.

In some embodiments, a computing system may include a chassis 100, a liner 104, and components 110. The chassis 100 may be a commodity chassis (such as is typically used for air-cooled designs, e.g., stamped or folded sheet metal attached using low-cost fasteners) and may hold the liner 104 and the components 110. In some embodiments, the chassis 100 may be made out of sheet metal. In some embodiments, the chassis 100 may be in a variety of sizes and form factors. The components 110 may include computer components, such as printed circuit boards, processors, mass storage devices, power supplies, and/or network cards and/or connectors. In some embodiments, the liner 104 may be a flexible liner that includes rigid over-molds 106 and 108 that are configured to align the components 110 in fixed positions relative to other components 110 or the chassis 100. The liner 104 may be of a thermoplastic material. In some embodiments, the liner 104 may flex around obstacles and features inside the chassis 100. The rigid over-molds 106 and 108 may be made of a different material from the liner 104 and may be molded to the liner 104. In some embodiments, the over-molds 106 and 108 may be made of a same material as the liner 104 but may have a considerably thicker structure such that the over-molds 106 and 108 are rigid whereas the liner 104 is flexible. The liner 104 may be filled with a cooling fluid, such as a dielectric fluid, to cool the components 110. Such a dielectric fluid may include deionized water or any fluid that does not conduct electricity.

The chassis 100 may include holes 102 and exterior over-molds 106 included on the liner 104 may line up with the holes 102 to precisely position the liner 104 (and its associated interior over-molds 108) in a fixed position relative to the chassis. In some embodiments, the exterior over-molds 106 may slide into the holes 102 of the chassis 100 and may help align the liner 104 and by extension the components 110 in a fixed position relative to the chassis 100 or components outside of the liner 104. The flexible liner 104 may also include interior over-molds 108 that enable the components 110 to be mounted to the flexible liner 104. A structural separation support 112 may be a rigid over-mold that separates respective interior rigid over-molds 108 by a fixed distance, such that computing components 110 when mounted to the rigid over-molds 108 separated by the structure separation support 112 are also separated by a fixed distance. The interior over-molds 108 and the structural separation support 112 may be used to help align the components in a fixed position relative to the chassis 100, in a fixed position relative to one another, or in a fixed position relative to components outside of the liner 104.

Figure 2:
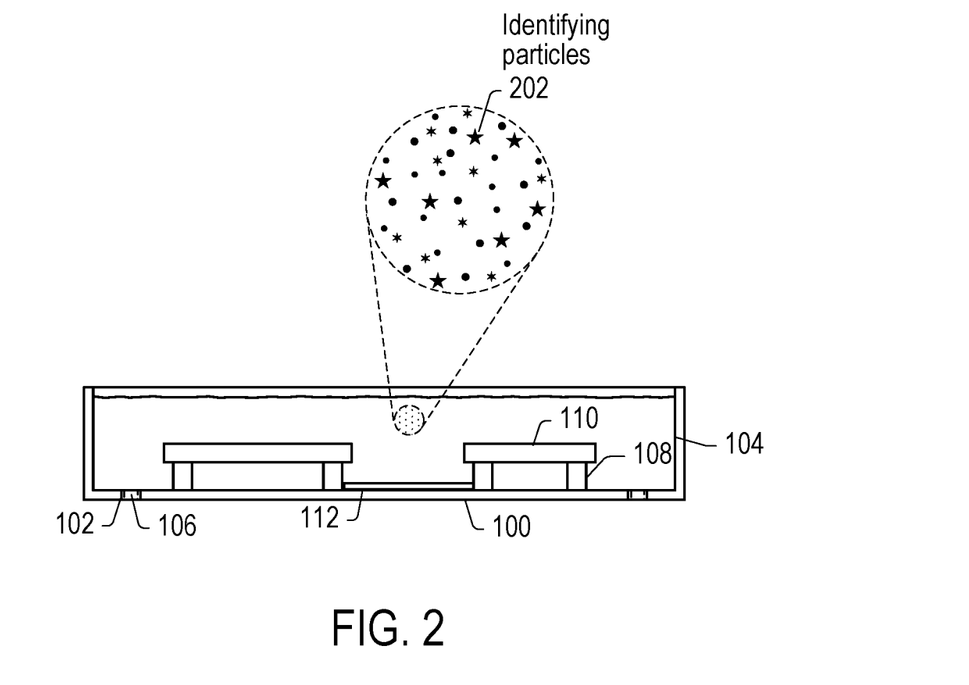
FIG. 2 illustrates a cut-away side view of an assembled computing system that uses a thermoplastic liquid immersion server chassis liner, the cut-away side view including a chassis, computer components, and a flexible liner with rigid over-molds, wherein the flexible liner is filled with a dielectric fluid that contains identifying particles, according to some embodiments.

FIG. 2 illustrates a cut-away side view of an assembled computing system that uses a thermoplastic liquid immersion server chassis liner, the cut-away side view including a chassis, computer components, and a flexible liner with rigid over-molds, wherein the flexible liner is filled with a dielectric fluid that contains identifying particles, according to some embodiments.

Some embodiments, such as shown in FIG. 1 may include further features such as shown in FIG. 2. In some embodiments, a computing system may include the liner 104 which may be filled with a cooling fluid, such as a dielectric fluid. The cooling fluid may be used to cool the components 110 inside the liner 104. The cooling fluid may include identify particles 202. In some embodiments, the concentration of the identifying particles 202 in the cooling fluid may be uniquely identifying. For example, to ensure the computing system hasn't been tampered with, a first concentration of the identifying particles 202 in the cooling fluid may be identified before providing the computing system, for example to a third-party. The concentration may later be tested in order to determine whether the cooling fluid has been altered or tampered with. If the cooling fluid has been altered there may be risk to the components 110 in the liner 104. In some embodiments, the cooling fluid may be sampled to identify contamination with or without the use of identifying particles 202.

Figure 3:
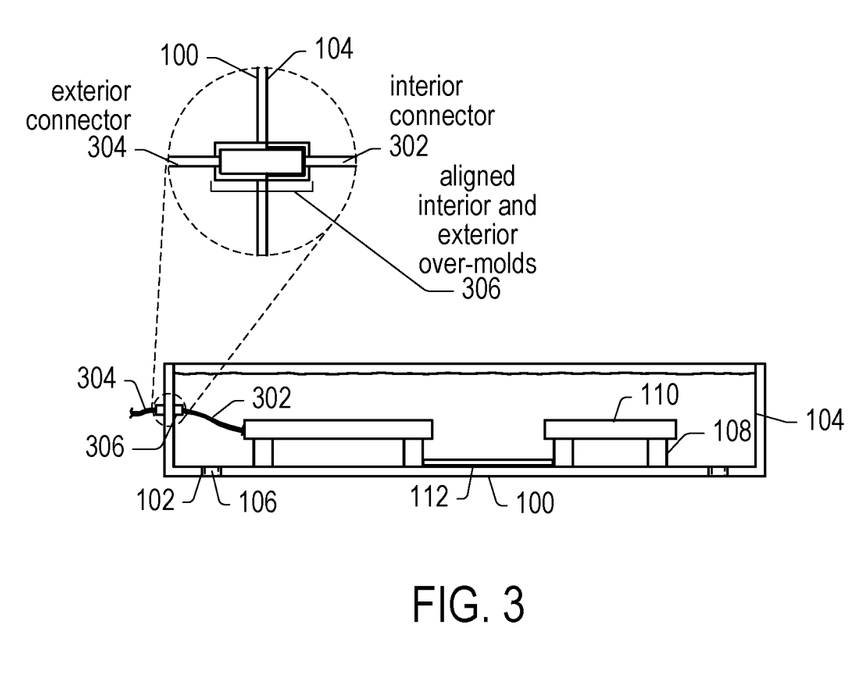
FIG. 3 illustrates a cut-away side view of an assembled computing system that uses a thermoplastic liquid immersion server chassis liner, the cut-away side view including a chassis, computer components, and a flexible liner with rigid over-molds filled with dielectric fluid, wherein a set of interior and exterior rigid-over-molds align on the flexible liner to enable connections to computer components inside the flexible liner from components outside the flexible liner, according to some embodiments.

FIG. 3 illustrates a cut-away side view of an assembled computing system that uses a thermoplastic liquid immersion server chassis liner, the cut-away side view including a chassis, computer components, and a flexible liner with rigid over-molds filled with dielectric fluid, wherein a set of interior and exterior rigid-over-molds align on the flexible liner to enable connections to computer components inside the flexible liner from components outside the flexible liner, according to some embodiments.

Some embodiments, such as shown in FIGS. 1-2, may include further features such as shown in FIG. 3. In some embodiments, a computing system may include a liner 104, such as shown in FIGS. 1-2, that may include aligned interior and exterior over-molds 306. The aligned interior and exterior over-molds may structurally support a first connector configured to accept insertions of a second connector that may connect on an exterior side of the liner 104. The aligned interior and exterior over-molds 306 may be configured to prevent any leakage of the dielectric fluid in the liner 104. In some embodiments, the connectors may be an interior connector 302 and an exterior connector 304, as shown in FIG. 3. In some embodiments, a hole in the chassis 100 may allow the exterior connector 304 to connect to components outside the chassis. The interior connector 302 may be connected to one or more components 110 inside the chassis.

FIGS. 4A-D illustrate different mounting options for fixedly coupling computer components to rigid over-molds of a flexible liner, according to some embodiments.

Figure 4A:
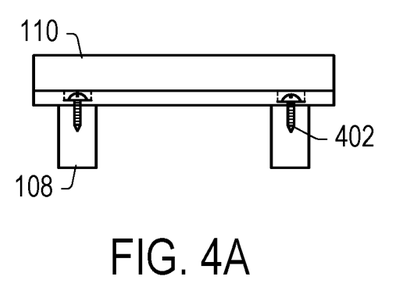
FIGS. 4A-D illustrate different mounting options for fixedly coupling computer components to rigid over-molds of a flexible liner, according to some embodiments.
Figure 4B:
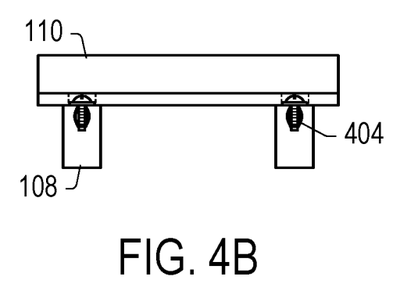
Figure 4C:
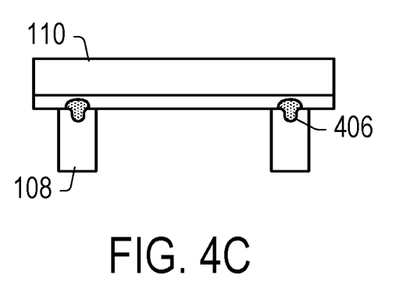
Figure 4D:
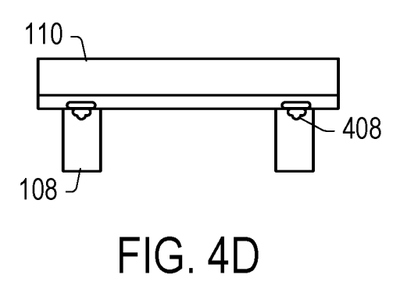

Some embodiments, such as shown in FIGS. 1-3, may include further features such as shown in FIGS. 4A-D. Components 110 may be attached to a liner using interior rigid over-molds 108. In some embodiments, the components 110 may be fixedly coupled to the interior rigid over-molds 108 by different mounting options. The mounting option may include screws 402. In some embodiments, the interior rigid over-molds 108 may be configured to accept the screws 402, such as shown in FIG. 4A. For example, the interior rigid over-molds 108 may include holes with threads to accept the screws 402. In some embodiments, another mounting option may include anchors 404, as shown in FIG. 4B. In such embodiments, the interior rigid over-molds 108 may be configured to accept the anchors 404. In some embodiments, the mounting option may include melted plastic 406, as shown in FIG. 4C. The interior rigid over-molds 108 may be configured to be locally melted form the melted plastic 406, wherein the melted plastic 406 attaches the component 110 to the rigid over-molds 108. For example, the interior rigid over-molds 108 may include upward extending portions used to form the melted plastic 406. In some embodiments, the mounting options may include rivets 408, as shown in FIG. 4D. In such embodiments, the interior rigid over-molds 108 may be configured to accept the rivets 408. In some embodiments, multiple mounting options or a mix of the mounting options may be used.

Figure 5:
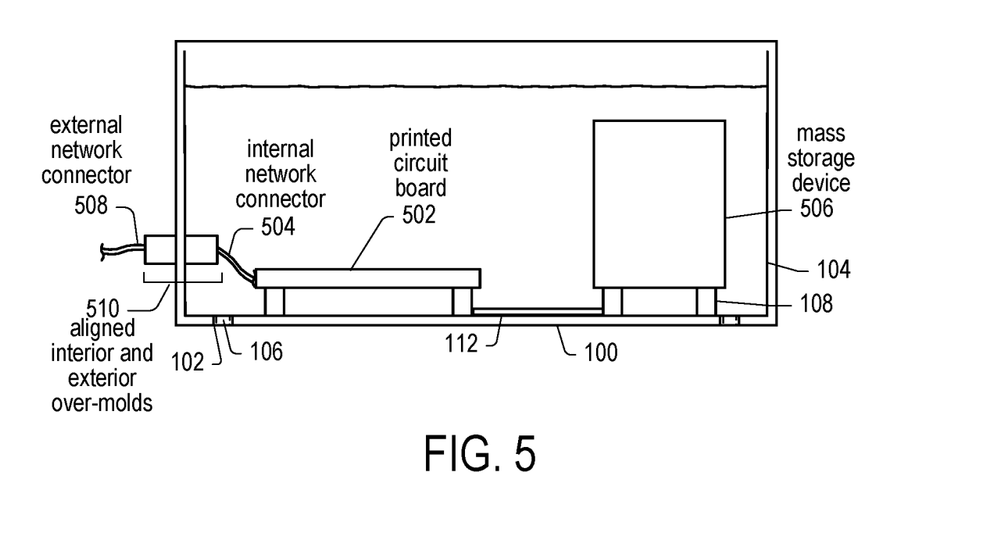
FIG. 5 illustrates a cut-away side view of an assembled computing system that uses a thermoplastic liquid immersion server chassis liner, the cut-away side view including a printed circuit board, a mass storage device, and network connectors, according to some embodiments.

FIG. 5 illustrates a cut-away side view of an assembled computing system that uses a thermoplastic liquid immersion server chassis liner, the cut-away side view including a printed circuit board, a mass storage device, and network connectors, according to some embodiments.

Some embodiments, such as shown in FIGS. 1, 2, 3, and 4A-D, may include further features such as shown in FIG. 5. In some embodiments, different components may be included in the flexible liner 104 for the chassis 100. The components, such as components 110 from FIGS. 1, 2, 3, 4A-D, may include, but are not limited to, internal network connectors 504, printed circuit boards 502, and/or mass storage devices 506. While not shown, various processors or cards may be attached to printed circuit boards 502, such as central processing units (CPUs), graphics processing units (GPUs), application specific integrated circuits (ASICs), field-programmable gate arrays (FPGAs), memory cards, networking cards, specialty cards, and/or various other computing components. In some embodiments an external network connector 508 extending outside of the liner 104 may be connected to the internal network connector 504 through aligned interior and exterior over-molds 510. The internal network connector 504 may connect to other components in the liner 104, such as a networking card attached to the printed circuit board 502 shown in FIG. 5. In some embodiments, the chassis 100 may only include one type of components. In other embodiments, the chassis 100 may include multiple types of components.

Figure 6:
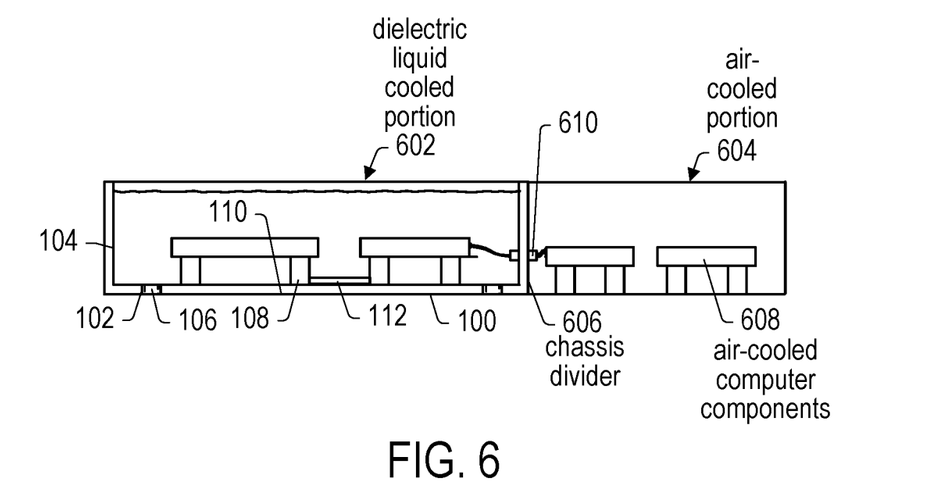
FIG. 6 illustrates a cut-away side view of an assembled computing system that uses a thermoplastic liquid immersion server chassis liner and that also includes an air-cooled section, the cut-away side view including a chassis, a flexible liner, and computer components, wherein a portion of the computer components are located in the flexible liner and cooled with dielectric fluid, and wherein another portion of the computer components are located outside of the flexible liner and cooled with air, according to some embodiments.

FIG. 6 illustrates a cut-away side view of an assembled computing system that uses a thermoplastic liquid immersion server chassis liner and that also includes an air-cooled section, the cut-away side view including a chassis, a flexible liner, and computer components, wherein a portion of the computer components are located in the flexible liner and cooled with dielectric fluid, and wherein another portion of the computer components are located outside of the flexible liner and cooled with air, according to some embodiments.

Some embodiments, such as shown in FIGS. 1, 2, 3, 4A-D and 5 may include further features, such as shown in FIG. 6. In some embodiments, the chassis may include both a liquid cooled portion 602 and an air-cooled portion 604, as shown in FIG. 6. A liner 104 may be filled with a cooling fluid and may act as the liquid cooled portion 602. The cooling fluid may cool the components 110 inside the liner 104. In some embodiments, a chassis divider 606 may provide further separation between each cooling portion. The air-cooled portion 604 may include air cooled computer components 608. In some embodiments, the air-cooled computer components 608 may be cooled by one or more fans. In some embodiments, the air-cooled computer components 608 may include components that are incompatible with liquid. In some embodiments, aligned interior and exterior over-molds, such as aligned interior and exterior over-molds 610, may connect components in the liquid cooled portion 602 to components in the air-cooled portion 604. In some embodiments, the aligned interior and exterior over-molds 610 may be structured in a similar manner as aligned interior and exterior over-molds 306 shown in FIG. 3.

FIGS. 7-11 are perspective views of a computer system that includes a flexible liner and computer components, wherein the flexible liner is sealed using different closures including, a heat melded closure, a zip closure, a fold closure, a snap closure, and a screw closure, according to some embodiments.

Figure 7:
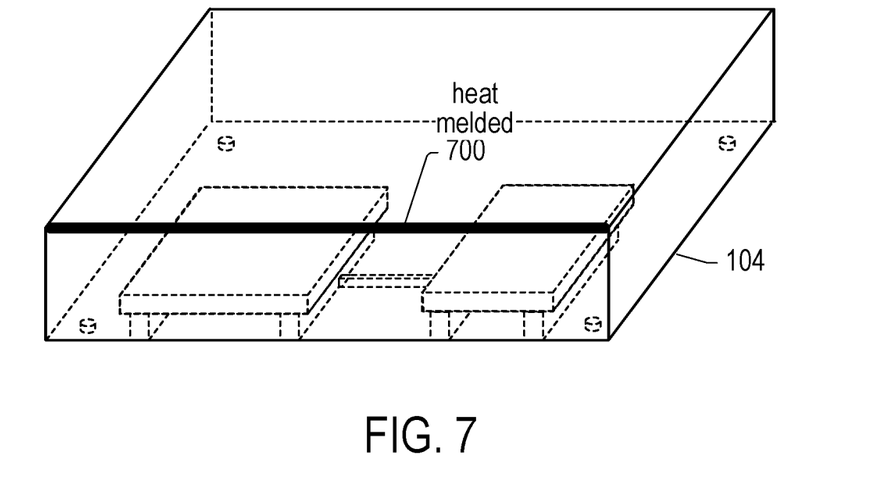
FIGS. 7-11 are perspective views of a computer system that includes a flexible liner and computer components, wherein the flexible liner is sealed using different closures including, a heat melded closure, a zip closure, a fold closure, a snap closure, and a screw closure, according to some embodiments.
Figure 8:
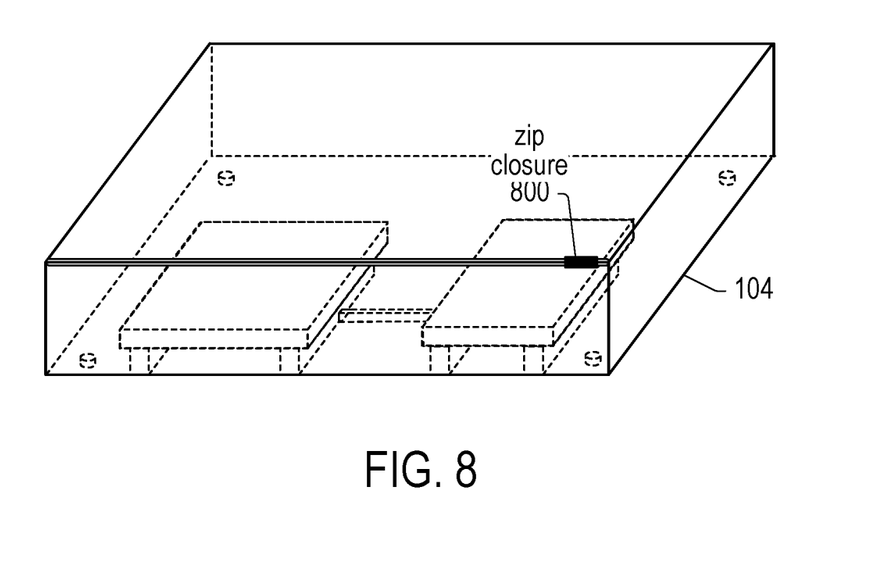
Figure 9:
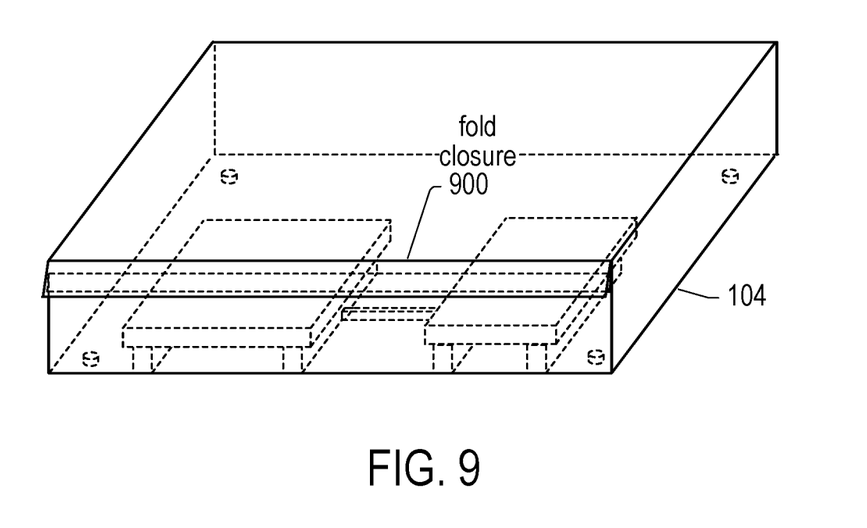
Figure 10:
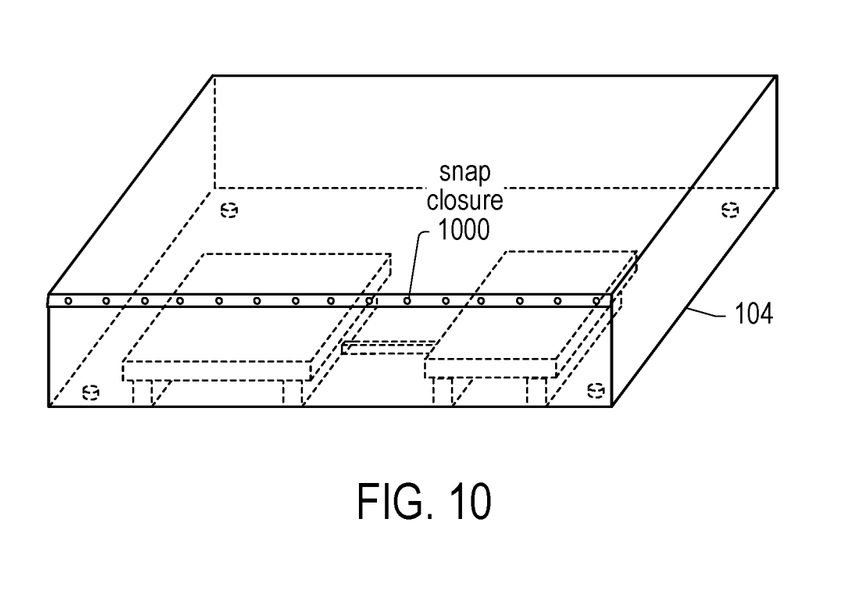
Figure 11:
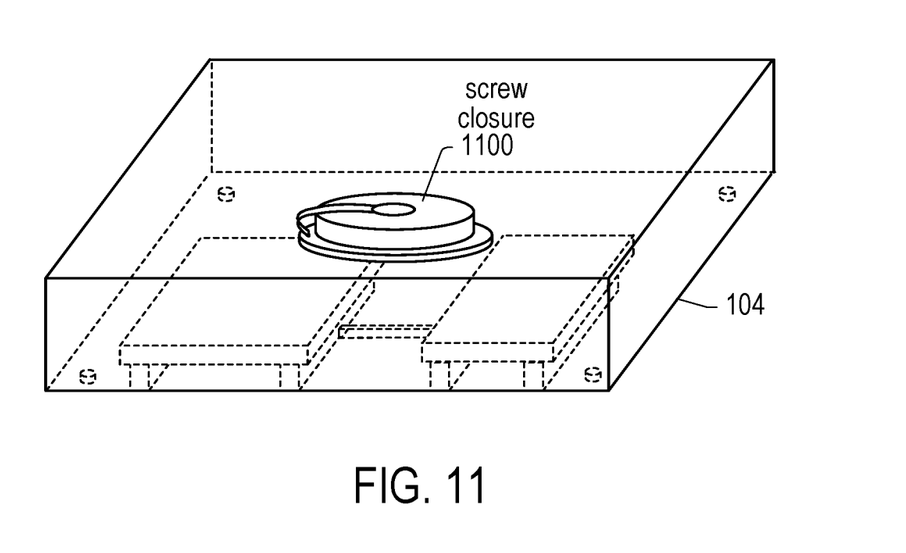

Some embodiments, such as shown in FIGS. 1, 2, 3, 4A-D, 5, and 6 may include further features, such as shown in FIG. 7-11. In some embodiments, the liner 104 may include a heat melded seam 700 to seal a top portion of the liner 104 closed, such as shown in FIG. 7. In some embodiments, a top portion of the liner 104 may include resealable closures. Such as shown in FIGS. 8-11, the top portion of the liner may include a zip closure 800, a fold closure 900, a snap closure 1000, or a screw closure 1100.

Figure 12:
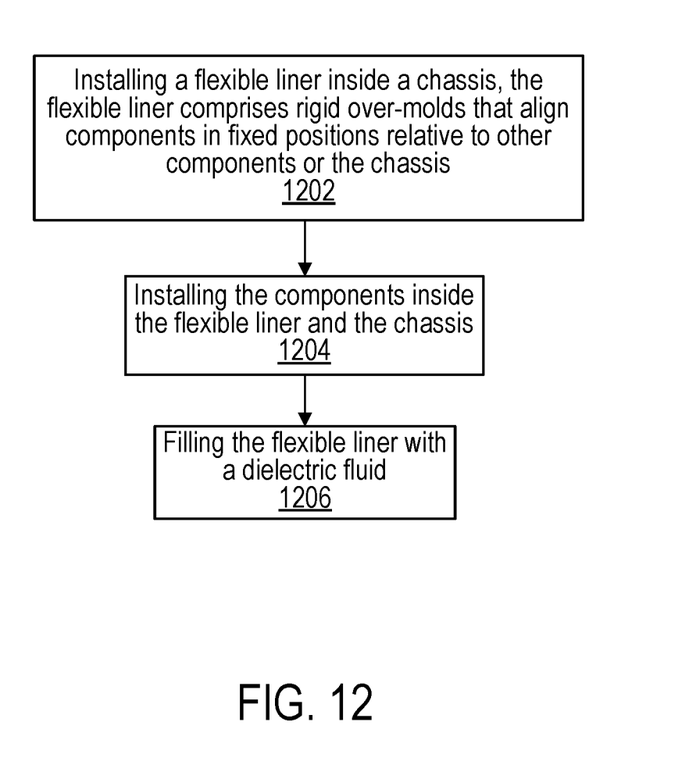
FIG. 12 is a flow diagram illustrating a process of assembling a liquid-cooled computing device, including installing a flexible liner inside a chassis, installing computer components inside the flexible liner using rigid over-molds of the flexible liner, and filling the flexible liner with a cooling fluid (e.g., dielectric fluid), according to some embodiments.

FIG. 12 is a flow diagram illustrating a process of assembling a liquid-cooled computing device, including installing a flexible liner inside a chassis, installing computer components inside the flexible liner, and filling the flexible liner with a cooling fluid, according to some embodiments.

In some embodiments, a process for assembling a liquid-cooled computing device may resemble a process such as that which is shown in FIG. 12. In block 1202, a flexible liner may be installed inside a chassis, wherein the flexible liner may comprise rigid over-molds that align components in fixed positions relative to other components or the chassis. In block 1204, the components may be installed inside the flexible liner and the chassis. In block 1206, the flexible liner may be filled with a cooling fluid, such as a dielectric fluid.

Figure 13:
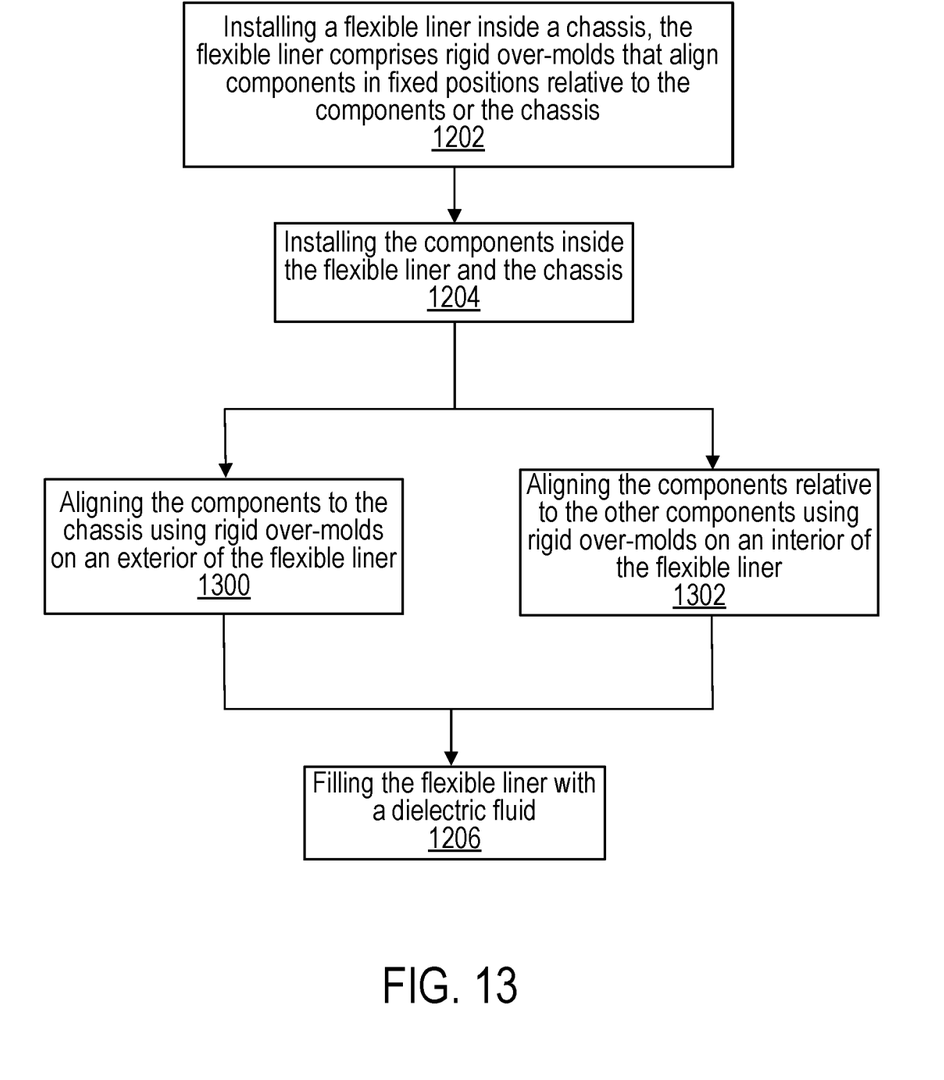
FIG. 13 is a flow diagram illustrating a process of assembling a liquid-cooled computing device, further including aligning components to a chassis and to other components using rigid over-mold structural components of the flexible liner, according to some embodiments.

FIG. 13 is a flow diagram illustrating a process of assembling a liquid-cooled computing device, further including aligning components to a chassis and to other components, according to some embodiments.

In some embodiments, a process further including aligning components to a chassis or to other respective ones of the components. For example, assembling a liquid-cooled computing device may resemble a process such as that which is shown in FIG. 13. Once the components are installed in the flexible liner and the chassis in block 1204, the components may be aligned to the chassis using rigid over-molds on an exterior side of the flexible liner 1300. In block 1302, the components may be aligned relative to the other respective ones of the components using rigid over-molds on an interior side of the flexible liner. The flexible liner may then be filled with a cooling fluid, such as a dielectric fluid, such as in block 1206. In some embodiments, blocks 1300 and 1302 may both be performed or in other embodiments, only one block may be performed.

Figure 14:
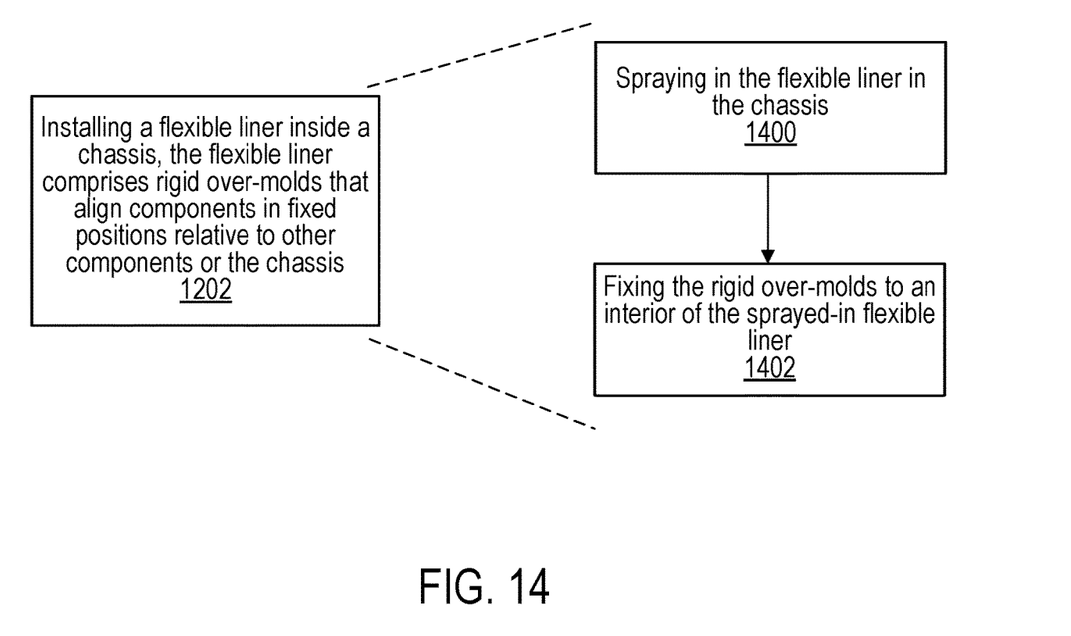
FIG. 14 is a flow diagram illustrating a process of installing a flexible liner inside a chassis, wherein the flexible liner is sprayed into the chassis, according to some embodiments.

FIG. 14 is a flow diagram illustrating a process of installing a flexible liner inside a chassis, wherein the flexible liner is sprayed into the chassis, according to some embodiments.

In some embodiments, a process for installing a flexible liner inside a chassis may resemble a process such as that which is shown in FIG. 13. In some embodiments, block 1202 may be further explained in blocks 1400 and 1402. In block 1400, the flexible liner may be sprayed in the chassis. In block 1402, the rigid over-molds may be fixed to an interior of the sprayed-in flexible liner. For example, prior to the sprayed in plastic hardening, other rigid plastic components (e.g., rigid over-molds) may be inserted in a film formed by spraying in the flexible liner.

The various methods as illustrated in the figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention encompasses all such modifications and changes and, accordingly, the above description to be regarded in an illustrative rather than a restrictive sense.

What is claimed is:

1. A computing system comprising:
   a chassis;
   one or more computer components; and
   a flexible liner, at least partially filled with a dielectric fluid, wherein:
      the flexible liner is positioned in the chassis and forms a liquid barrier that retains the dielectric fluid; and
      the flexible liner comprises one or more rigid over-molds, wherein the one or more rigid over-molds are configured to align respective ones of the one or more computer components in fixed positions relative to other respective ones of the one or more computer components or the chassis.

2. The computing system of claim 1, wherein a portion of the one or more rigid over-molds are located on an exterior of the flexible liner, and wherein the portion of the one or more rigid over-molds located on the exterior of the flexible liner are configured to fixedly couple the flexible liner to the chassis.

3. The computing system of claim 1, wherein a portion of the one or more rigid over-molds are located on an interior of the flexible liner, and wherein the portion of the one or more rigid over-molds located on the interior of the flexible liner are configured to fixedly couple to the respective ones of the one or more computer components to align the respective ones of the one or more computer components in the fixed positions.

4. The computing system of claim 1, wherein the one or more rigid over-molds comprise:
   a set of over-molds configured to:
      structurally support a first connector configured to accept insertion of a second connector that connects on an exterior side of the flexible liner; and
      facilitate a connection from the first connector to a given one of the one or more computer components mounted on an interior-side of the flexible liner,
   wherein the set of over-molds comprises:
      a first rigid over-mold located on the interior of the flexible liner; and
      a second rigid over-mold located on the exterior of the flexible liner,
      wherein the first rigid over-mold on the interior of the flexible liner is aligned with the second rigid over-mold on the exterior of the flexible liner.

5. The computing system of claim 1, wherein the dielectric fluid comprises identifying particles and wherein a concentration of the identifying particles in the dielectric fluid is uniquely identifying for the fluid.

6. A flexible liner for retaining a dielectric fluid in a liquid-cooled computing device, the flexible liner comprising:
   a flexible membrane configured to be positioned in a chassis to form a liquid barrier that retains the dielectric fluid; and
   one or more rigid over-molds, wherein the one or more rigid over-molds are configured to align respective ones of computer components of the liquid-cooled computing device in fixed positions relative to other respective ones of the computer components or the chassis.

7. The flexible liner of claim 6, wherein at least a portion of the one or more rigid over-molds are located on an exterior of the flexible liner and are configured to fixedly couple to the chassis.

8. The flexible liner of claim 6, wherein at least a portion of the one or more rigid over-molds are located on an interior of the flexible liner and are configured to fixedly couple to one or more of the respective ones of the computer components of the liquid-cooled computing device.

9. The flexible liner of claim 6, wherein at least a portion of the one or more rigid over-molds are configured to accept mounting brackets for the aligning of the respective ones of the computer components of the liquid-cooled computing device.

10. The flexible liner of claim 6, wherein respective ones of the one or more rigid over-molds are configured to enable inserting connectors exterior to the flexible liner, wherein a first rigid over-mold on the interior of the flexible liner is aligned with a second rigid over-mold on the exterior of the flexible liner.

11. The flexible liner of claim 6, wherein the one or more rigid over-molds comprise respective sets of rigid over-molds configured to mount different types of the computer components.

12. The flexible liner of claim 11, wherein the different types of the computer components comprise two or more of:
   a printed circuit board;
   a power supply;
   a mass storage device; or
   an external network connector.

13. The flexible liner of claim 6, further comprising a heat-melded closure on a top portion of the flexible liner.

14. The flexible liner of claim 6, further comprising a re-sealable closure on a top portion of the flexible liner.

15. The flexible liner of claim 14, wherein the re-sealable closure comprises a fold closure, a zip closure, a screw closure, or a snap closure.

16. A method of assembling a liquid-cooled computing device, comprising:
   installing a flexible liner inside a chassis, wherein the flexible liner comprises rigid over-molds configured to align computer components in fixed positions relative to other respective ones of the computer components or the chassis;
   installing the computer components inside the flexible liner and the chassis; and
   filling the flexible liner with a fluid.

17. The method of claim 16, further comprising:
   aligning the computer components to the chassis using the rigid over-molds on an exterior of the flexible liner.

18. The method of claim 16, further comprising:
   aligning the computer components relative to other respective ones of the computer components using the rigid over-molds on an interior of the flexible liner.

19. The method of claim 16, further comprising:
   spraying in the flexible liner in the chassis; and
   fixing the rigid over-molds to an interior of the sprayed-in flexible liner.

20. The method of claim 16, wherein the fluid is a dielectric fluid comprising identifying particles and wherein a concentration of the identifying particles in the dielectric fluid is uniquely identifying for the fluid.

* * * * *